United States Patent [19]

Morimoto et al.

[11] Patent Number: 4,915,737
[45] Date of Patent: Apr. 10, 1990

[54] ALLOY TARGET FOR MANUFACTURING A MAGNETO-OPTICAL RECORDING MEDIUM

[75] Inventors: Toshio Morimoto; Keizo Kazama; Yasuhiro Okajima; Yasuhiro Tsugita; Shinobu Endo, all of Ichikawa, Japan

[73] Assignee: Sumitomo Metal Mining Company Limited, Japan

[21] Appl. No.: 188,203

[22] Filed: Apr. 29, 1988

[30] Foreign Application Priority Data

Apr. 30, 1987 [JP] Japan .................................. 62-104770

[51] Int. Cl.$^4$ .............................................. C22C 29/00
[52] U.S. Cl. ........................................ 75/246; 75/230; 75/243; 419/23; 419/45
[58] Field of Search ............. 75/246, 0.5 AA, 0.5 AB, 75/0.5 B, 84, 123, 230, 243; 419/45, 23; 428/332, 336, 928, 694; 148/301

[56] References Cited

U.S. PATENT DOCUMENTS 4,578,242  3/1986  Sharma ................................. 75/84
4,620,872  11/1986  Hijikata et al. ...................... 75/246
4,767,455  9/1988  Jourdan ................................ 75/84.4

Primary Examiner—Stephen J. Lechert, Jr.
Assistant Examiner—Nina Bhat
Attorney, Agent, or Firm—Watson, Cole, Grindle & Watson

[57] ABSTRACT

An alloy target for making a magneto-optical recording medium by sputtering comprises an alloy containing 10 to 50 atom % of at least one rare earth element selected from among Sm, Nd, Gd, Tb, Dy, Ho, Tm and Er, with a balance consisting substantially of at least one transition metal selected from among Co, Fe and Ni. The alloy has a mixed structure composed of at least three phases of intermetallic compounds formed by the rare earth element and the transition metal.

5 Claims, No Drawings

ALLOY TARGET FOR MANUFACTURING A MAGNETO-OPTICAL RECORDING MEDIUM

BACKGROUND OF THE INVENTION

1. Field of the Invention

This invention relates to an alloy target which is suitable for use in the manufacture of a magneto-optical recording medium by sputtering.

2. Description of the Prior Art

A magneto-optical memory has been drawing a great deal of attention as it facilitates the erasure and re-recording of information. Single-crystal materials such as garnets, polycrystalline materials such as MnBi and PtCo, or amorphous materials such as alloys of rare earth elements and transition metals are usually employed for manufacturing a magneto-optical memory.

The use of an amorphous alloy comprising a rare earth element or elements and a transition metal or metals, such as Tb—Fe—Co or Gd—Tb—Fe, provides a variety of advantages. For example, it enables the manufacture of a magneto-optical memory which requires only a small amount of energy for recording information, one which is free from any grain boundary noise, or one having a relatively large size. A film of such an amorphous alloy is often formed by sputtering, i.e., by causing ions to collide with a target to form a film of a substrate positioned near it. The target usually comprises (1) a composite material prepared by attaching chips of a rare earth element to a sheet of, e.g., iron, or embedding them therein, (2) an alloy prepared by melting a rare earth element and a transition metal by, e.g., arc discharge, or (3) a sintered compact prepared by mixing an alloy powder which has been obtained by crushing a lump of an alloy formed by melting a rare earth element and a transition metal, with a transition metal powder, and sintering their mixture by powder metallurgy, as described in Japanese Laid-Open Patent Specification No. 230903/1985.

A good target material is one which satisfies the following requirements:
(a) High toughness;
(b) A structure which is sufficiently dense to ensure the stability of sputtering to form a film;
(c) A composition which is sufficiently uniform to ensure the formation of a film of uniform composition;
(d) An oxygen content which is sufficiently low to ensure the formation of a film having good magneto-optical properties; and
(e) A low cost.

None of the known materials as hereinabove described, however, satisfies all of the requirements. More specifically, the material as set forth at (1) above fails to satisfy the requirements (c) and (e), the material as set forth at (2) fails to satisfy the requirements (a), (d) and (e), and the material as set forth at (3) fails to satisfy the requirements (b), (d) and (e).

SUMMARY OF THE INVENTION

It is, therefore, an object of this invention to provide an improved alloy target which can satisfy all of the requirements as hereinabove stated.

The assignee of this invention proposed a process for manufacturing an improved target in Japanese Patent Application No. 99808/1986. The inventor of this invention has made an extensive study of a variety of target materials which have been manufactured by that process, and has found that they are novel in composition and structure. While the known sintered alloy material has been brittle due to the presence of a phase of an intermetallic compound and it has been usual to improve its brittleness by introducing fine particles of a transition metal to form a binding phase, the inventor has found that a material containing at least three phases of intermetallic compounds is sufficiently tough, even if it does not have any binding phase formed by particles of a metal.

The object of this invention as hereinabove stated is, therefore, attained by an alloy target which comprises an alloy containing 10 to 50 atom % of at least one rare earth element selected from the group consisting of Sm, Nd, Gd, Tb, Dy, Ho, Tm and Er, the balance being substantially at least one transition metal selected from the group consisting of Co, Fe and Ni, the alloy having a mixed structure composed of at least three phases of intermetallic compounds formed by the rare earth element and the transition metal.

The alloy target of this invention has a variety of advantages including (a) high toughness, (b) high density, (c) uniform composition, (d) a sufficiently low oxygen content, and (e) a low cost.

Other features and advantages of this invention will be apparent from the following detailed description.

DETAILED DESCRIPTION OF THE INVENTION

The alloy target of this invention contains 10 to 50 atom % of at least one rare earth element selected from among Sm, Nd, Gd, Tb, Dy, Ho, Tm and Er, while the balance consists substantially of at least one transition metal selected from among Co, Fe and Ni. No material containing less than 10 atom %, or more than 50 atom %, of a rare earth element or elements would be able to form a film having good magneto-optical properties when sputtered. The target of this invention may contain unavoidable impurities, such as Ca, Si, C, P, S and Mn.

The alloy target of this invention has a mixed structure compound of at least three phases of intermetallic compounds formed by the rare earth element or elements and the transition metal or metals. No material having only one or two phases of intermetallic compounds would be satisfactorily tough. The target contains at least 5% by volume of each of at least three such phases. Each phase preferably has a size not exceeding 500 microns. Each phase may be particulate, angular or columnar, or may have any other shape without limitation in particular.

The alloy target of this invention can be manufactured by a process which will now be described by way of example. A powder of an alloy of a rare earth element and a transition metal having a particle size of preferably 100 mesh (as determined by means of a Tyler standard sieve, which will be the case throughout the following description) is prepared by a reduction and diffusion process. More specifically, a powder of an oxide of at least one rare earth element, which is selected from among powders of oxides of Sm, Nd, Gd, Tb, Dy, Ho, Tm and Er, is mixed with a powder of at least one transition metal, Co, Fe or Ni, and a reducing agent such as metallic calcium. The resulting mixture is placed in a vessel and heated at a temperature of 900 C. to 1300 C. in an inert gas atmosphere having an atmospheric pressure, or in a vacuum. The resulting product of reaction is placed in water to form a slurry and the slurry is treated with water and an aqueous solution of an acid. The alloy powder is, then, sintered by a process of powder metallurgy to yield a sintered alloy target.

A variety of processes can be employed for sintering the alloy powder. For example, the alloy powder is either simply compressed at a pressure of 0.5 to 5 t/cm$^2$ and an ordinary room temperature, or shaped at a pressure of 0.5 to 2 t/cm$^2$ by a hydrostatic press, and the compacted product is sintered at a temperature of 900° C. to 1300° C. for one to five hours in a vacuum or an argon gas atmosphere (cold pressing and sintering). Alternatively, the powder is sintered at a pressure of 0.1 to 0.5 t/cm$^2$ and a temperature of 800° C. to 1200° C. for one to five hours in a vacuum (hot pressing). It is also possible to place the powder in an elastic body and sinter it at a temperature of 800° C. to 1200° C. and a pressure of 0.1 to 2 t/cm$^2$ for one to five hours (hot isostatic pressing).

The alloy powder as obtained by the reduction and diffusion process has a central phase of a transition metal and a phase of an intermetallic compound of a rare earth element and a transition metal covering the transition metal phase. When the powder is sintered by a process of powder metallurgy, the transition metal phase disappears as a result of diffusion and reaction and the sintered alloy has a mixed structure composed of at least three phases of intermetallic compounds formed by the rare earth element and the transition metal.

The invention will now be described more specifically with reference to a few examples thereof.

EXAMPLE 1

407.4 g of Tb$_4$O$_7$ having an average diameter not exceeding three microns, 250.6 g of iron powder having a grain size not exceeding 200 mesh, 20.4 g of cobalt powder having a grain size not exceeding 200 mesh, 305.1 g of metallic calcium having a grain size not exceeding 4 mesh and 40.7 g of anhydrous calcium chloride having a grain size not exceeding 100 mesh, each having a purity of at least 99.9% by weight, were carefully mixed together to produce a target of a Tb—Fe—Co alloy. The mixture was placed in a reaction vessel of the stainless steel construction and was heated to a temperature of 1000° C. in about an hour in a stream of high-purity argon gas. It was held at that temperature for five hours and was thereafter cooled to an ordinary room temperature, whereby a lump of mixture weighing 1012.3 g was obtained. The lump was put in water. It was decrepitated to yield a slurry. A suspension of Ca(OH)$_2$ was removed from the slurry by decantation and water was poured into the slurry. The slurry was stirred for five minutes and was thereafter subjected to decantation again. The pouring of water, stirring and decantation were repeated until calcium oxide was fully separated from the alloy powder. Water was added to the alloy powder to for a slurry and dilute acetic acid was dropped into the slurry under stirring until it had a pH of 4.5. The slurry was left at a standstill for 20 minutes and was thereafter filtered. The resulting alloy powder was washed in water and thereafter in ethanol several times and was dried at a temperature of 50° C. and a reduced pressure of $1 \times 10^{-2}$ Torr for 12 hours.

A graphite mold having an inside diameter of 130 mm was charged with 540 g of the alloy powder. The powder was sintered in a vacuum having a reduced pressure of $5 \times 10^{-5}$ Torr. A pressure of 0.15 t/cm$^2$ was applied to the powder under heat until it was heated to a temperature of 1000° C. and a pressure of 0.25 t/cm$^2$ was thereafter applied thereto, while it was held at that temperature for an hour. The sintered alloy product, or target was cooled to an ordinary room temperature and removed from the mold. A visual inspection of the sintered product did not reveal any crack thereon. No crack was found in the interior of the product, either, as a result of X-ray inspection. The sintered product contained 55.4% Tb, 3.4% Co and 41.0% Fe, all by weight. It also contained 0.10% O$_2$ and 0.02% Ca, both by weight, as impurities. It had a relative density of 100%. As a result of examination by a metal microscope, EPMA, etc., it was found to have a mixed structure composed of phases of particulate intermetallic compounds, such as Tb$_{10}$Fe$_{88}$Co$_2$, Tb$_{40}$Fe$_{50}$Co$_{10}$, Tb$_{57}$Fe$_{23}$Co$_{20}$ and Tb$_{32}$Fe$_{68}$, having a size of 10 to 60 microns. No phase of a rare earth element or transition metal alone was found.

The alloy target, which had a diameter of 130 mm and a thickness of 4.5 mm, was used to form a film having a thickness of 3000 Å by sputtering on a substrate of soda glass. The sputtering was carried out by employing argon gas having a pressure of $6 \times 10^{-5}$ Torr and an electric power of 4 W/cm$^2$. The sputtering operation could be continued with high stability. The film showed good magneto-optical properties, i.e., a polar magnetic Kerr rotation angle ($\theta$k) of 0.30° and a coercive force (H$_c$) of 1100 kA/m. The surface of the film was analyzed for Tb after 5, 20, 40 and 60 hours, respectively, of sputtering. The amounts of Tb showed a difference of only 0.6% by weight. After sputtering, the target was inspected for cracks again as hereinabove described. No crack was found.

EXAMPLE 2

A number of sintered alloy targets were prepared by repeating the process of EXAMPLE 1, except that different alloys were prepared from different mixtures of powders of starting materials as shown in Table 1 below. The targets were likewise used to form films by sputtering.

TABLE 1

| Sample No. | Target alloy | Amounts of starting powders (g) | | | | | |
| --- | --- | --- | --- | --- | --- | --- | --- |
| | | Gd$_2$O$_3$* | Tb$_4$O$_7$ | Co | Fe | Ca | CaCl$_2$ |
| 1 | Gd$_{40}$Co$_{60}$ | 438 | — | 218 | — | 218 | 44 |
| 2 | Gd$_{30}$Co$_{70}$ | 365 | — | 263 | — | 181 | 37 |
| 3 | Gd$_{12}$Tb$_{12}$Fe$_{76}$ | 161 | 166 | — | 298 | 173 | 33 |

*Gd$_2$O$_3$ powder having a purity of at least 99.9% by weight and an average particle diameter not exceeding 3 μm.

The results are shown in TABLE 2. All of the three samples which had been prepared showed substantially the same results, as will be summarized below:

(1) No crack had been found in any of the targets before it was used for sputtering, nor was any crack found thereafter;

(2) No phase of a rare earth element or transition metal alone was found in any of the sintered products;
(3) The intermetallic compounds in all of the sintered products were particulate and had a size of 10 to 60 microns; and
(4) Sputtering could be continued with high stability throughout the formation of any of the films. In the above, the size and percentage by volume of existing intermetallic compounds were measured by a cutting method.

structure composed of at least three phases of an intermetallic compound formed by said rare earth element and said transition metal, and containing no phases composed exclusively of a rare earth element or a transition metal.

2. An alloy target is set forth in claim 1, wherein said alloy further contains at least one element selected from the group consisting of Ca, Si, C, P, S and Mn.

3. An alloy target as set forth in claim 1, wherein said alloy contains at least 5% by volume of each of said phases.

TABLE 2

| Sample No. | Sintered target composition (wt %) | | | | | | Relative density (%) | Existing intermetallic compound phase | Polar magnetic Kerr rotation angle $\theta_k$ (°) | Film Coercive force Hc (kAm$^{-1}$) | Film Difference of rare earth element (wt %) |
|---|---|---|---|---|---|---|---|---|---|---|---|
| | Gd | Tb | Co | Fe | O$_2$ | Ca | | | | | |
| 1 | 64.1 | — | 35.7 | — | 0.18 | 0.07 | 100 | Co$_3$Gd$_4$,Co$_2$Gd, Co$_3$Gd,Co$_7$Gd$_2$, Co$_5$Gd,Co$_{17}$Gd$_2$ | 0.25 | 300 | 1.0 |
| 2 | 53.5 | — | 46.3 | — | 0.12 | 0.02 | 99.8 | same as above | 0.28 | 400 | 0.9 |
| 3 | 23.5 | 23.7 | — | 52.6 | 0.11 | 0.02 | 99.3 | Gd$_1$Tb$_2$Fe$_{97}$ Gd$_6$Tb$_6$Fe$_{88}$ Gd$_{26}$Tb$_{12}$Fe$_{62}$ Gd$_{11}$Tb$_{23}$Fe$_{66}$ | 0.25 | 250 | 0.6 |

What is claimed is:

1. An alloy target for making a magneto-optical recording medium by sputtering comprising an alloy containing 10 to 50 atom % of at least one rare earth element selected from the group consisting of Sm, Nd, Gd, Tb, Dy, Ho, Tm and Er, the balance being substantially at least one transition metal selected from the group consisting of Co, Fe and Ni, said alloy having a mixed 4. An alloy target as set forth in claim 1, wherein each of said phases has a size up to and including 500 microns.

5. An alloy target as set forth in claim 1, wherein each of said phases has a respective shape that is either particulate, angular or columnar.

* * * * *